US 6,679,131 B2

(12) United States Patent
Kato

(10) Patent No.: US 6,679,131 B2
(45) Date of Patent: Jan. 20, 2004

(54) CAM APPARATUS AND PICK AND PLACE APPARATUS UTILIZING THE SAME

(75) Inventor: Heizaburo Kato, Shizuoka (JP)

(73) Assignee: Sankyo Manufacturing Co., Ltd., Tokyo (JP)

( * ) Notice: Subject to any disclaimer, the term of this patent is extended or adjusted under 35 U.S.C. 154(b) by 81 days.

(21) Appl. No.: 09/966,585

(22) Filed: Sep. 28, 2001

(65) Prior Publication Data
US 2002/0035881 A1 Mar. 28, 2002

(51) Int. Cl.$^7$ .............................. F16H 37/16; F16D 3/06
(52) U.S. Cl. ................ 74/53; 74/22 R; 74/53; 74/84 R; 74/107; 74/569
(58) Field of Search .................. 74/53, 84 R, 54, 74/569, 22 R, 55, 107

(56) References Cited

U.S. PATENT DOCUMENTS

| | | |
|---|---|---|
| 3,869,924 A | 3/1975 | Beezer |
| 4,630,493 A | 12/1986 | Kato |
| 4,666,124 A * | 5/1987 | Giacobbi ..................... 261/56 |
| 4,703,607 A * | 11/1987 | Propper et al. ............... 53/307 |
| 5,667,283 A * | 9/1997 | Drennen et al. ......... 303/115.2 |
| 6,186,014 B1 | 2/2001 | Kato |
| 6,244,133 B1 * | 6/2001 | Donald et al. ................ 74/567 |

FOREIGN PATENT DOCUMENTS

| | | |
|---|---|---|
| DE | 3318398 | 5/1983 |
| DE | 3318398 A | 11/1984 |
| JP | 08-111756 | 5/1996 |
| JP | 09-297145 | 11/1997 |

OTHER PUBLICATIONS

Formal Objection with English translation, Dec. 17, 2002.
Formal Objection with English translation, Jan. 3, 2003.

* cited by examiner

*Primary Examiner*—Thomas R. Hannon
*Assistant Examiner*—Colby Hansen
(74) *Attorney, Agent, or Firm*—Harness, Dickey, & Pierce, P.L.C.

(57) ABSTRACT

There is provided a cam apparatus which operates an output shaft by converting a continuous rotational motion at a constant speed of an input shaft into a complex rotation super-positioning an oscillating rotational motion and a rotational motion at an inconstant speed. The cam apparatus comprises an input shaft (5); a first output shaft (7); rotational motion converting cam mechanism (21); a slider member (9); a relative rotation regulating cam mechanism (31); a cam link mechanism (41); a second output shaft (11); and a motion converting cam mechanism (51) engaged with and between the second output shaft and the slider member. The motion converting cam mechanism transforms the reciprocal rectilinear motion displacement of the slider member into the oscillating rotation of the second output shaft to transmit the same thereto, and transmits the rotational motion at an inconstant speed of the slider member to the second output shaft.

4 Claims, 11 Drawing Sheets

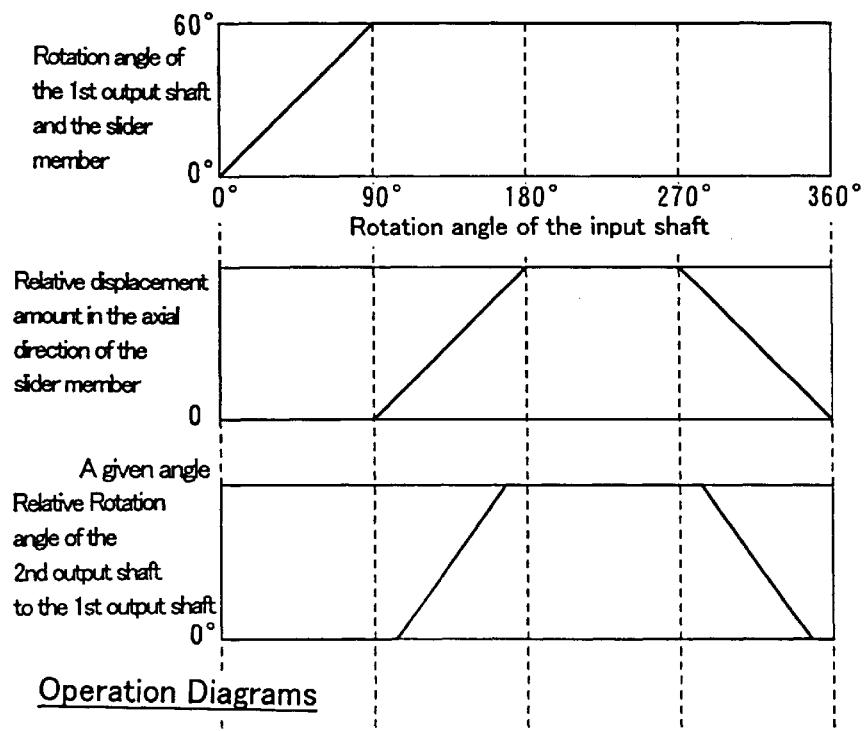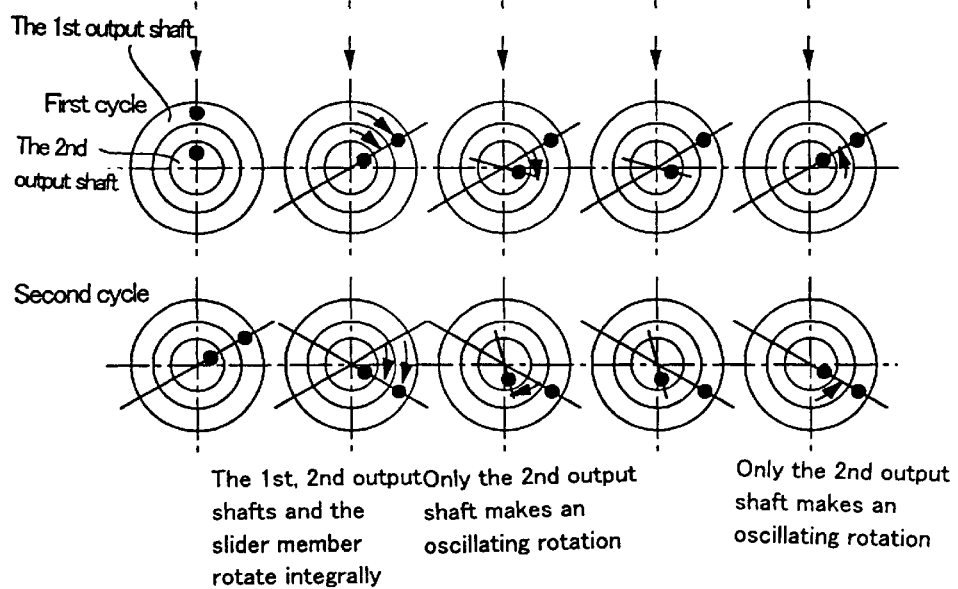
FIG. 6

FIG. 10A   The snatching member in the unfolded state
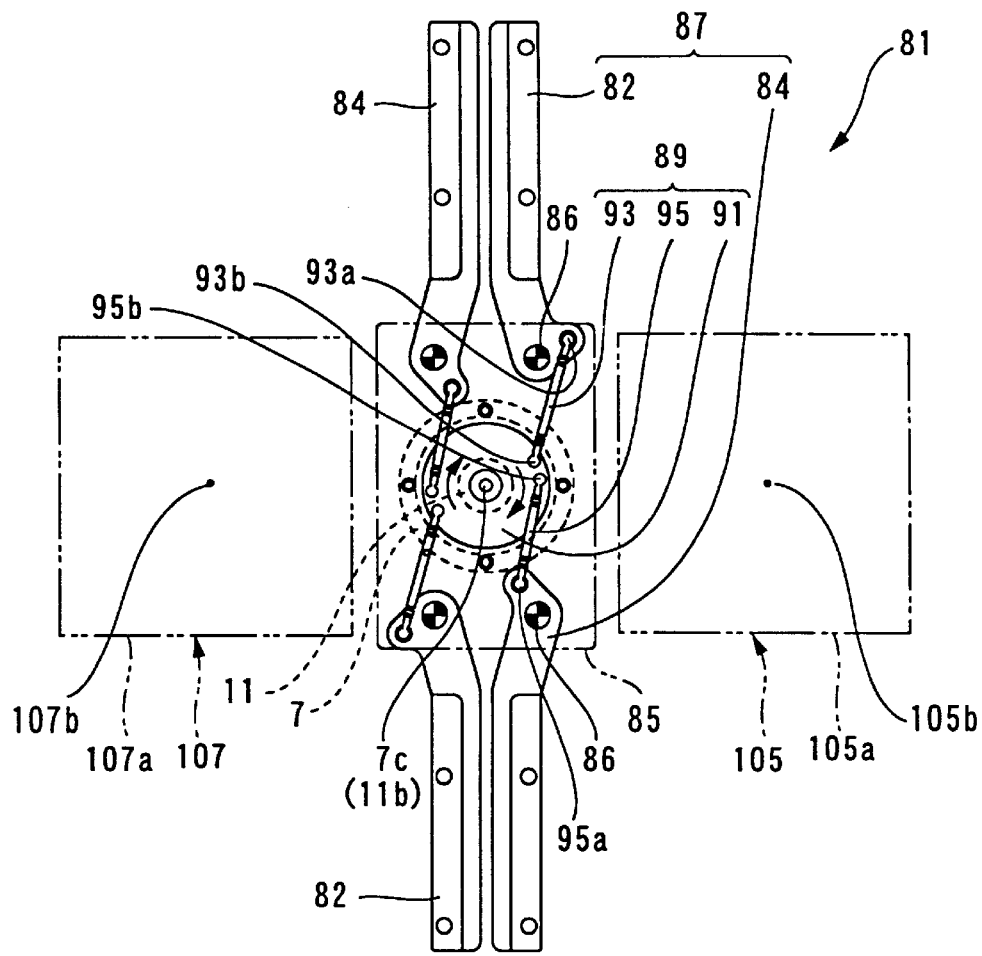
FIG. 10B   The snatching member in the folded state
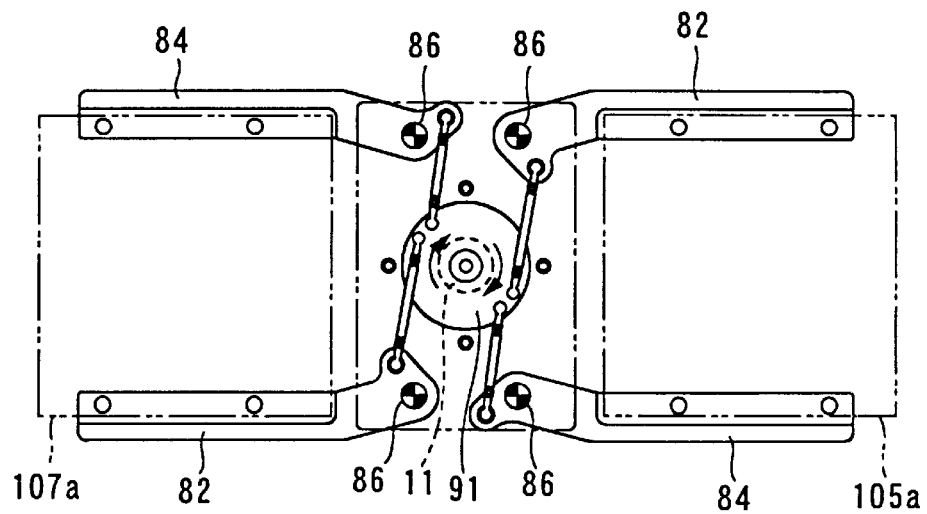

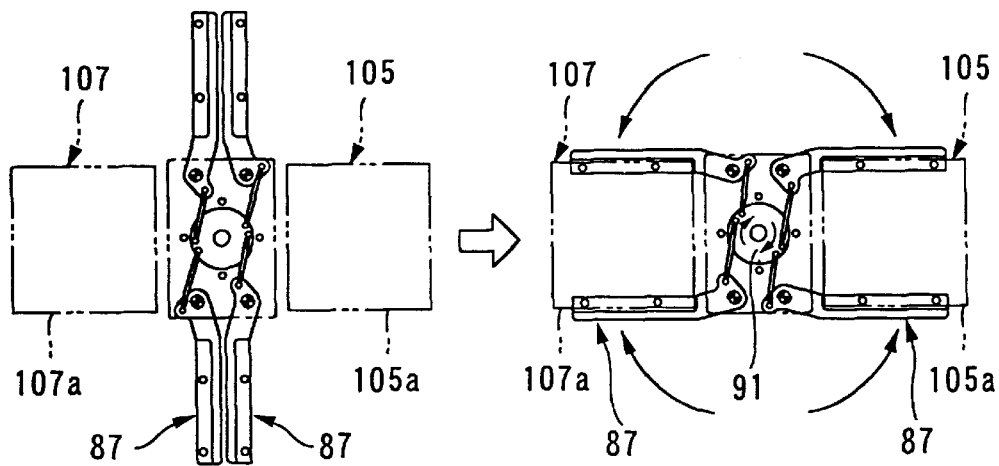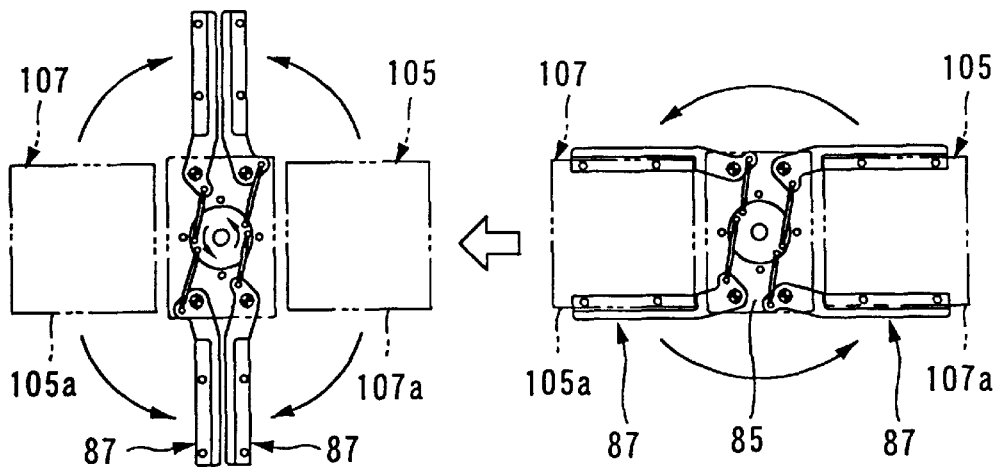
FIG. 11

CAM APPARATUS AND PICK AND PLACE APPARATUS UTILIZING THE SAME

BACKGROUND OF THE INVENTION

1. Field of the Invention

This invention relates to a cam apparatus for converting continuous rotational motions at a constant speed transmitted from driving sources such as a motor to the input shaft into rotational motions of the output shaft such as intermittent indexing and swing through the cam mechanism, and a pick and place apparatus in which the former is used.

2. Description of the Related Art

So far various types of cam apparatus have been proposed for converting continuous rotational motions at a constant speed transmitted from the driving source such as a motor to the input shaft into rotational motions of a specific pattern such as intermittent indexing through the cam mechanism. Among them, the Japanese Patent Application Laid Open No. 1997-297145 and others disclose cam apparatuses capable of converting the continuous rotational motion at a constant speed of an input shaft and outputting different rotational motions on two output shafts provided on the same shaft.

A sectional side elevation of this cam apparatus is shown in FIG. 12A and a sectional plan view is shown in FIG. 12B.

As illustrated in these plans, an input shaft 117 is rotatably supported on a housing 112 of this cam apparatus 111, and this input shaft 117 continuously rotates at a constant speed being driven by a driving source not shown. On this input shaft 117, a globoidal cam 113 for driving continuous rotation (referred to hereinafter as "cam for driving continuous rotation") and a globoidal cam 115 for driving oscillating rotation (referred to hereinafter as "cam for driving oscillating rotation") are provided jointly in the axial direction. Then, the cam for driving continuous rotation 113 is engaged with a turret 119, causes an output shaft for continuous rotation 121 above to rotate continuously, and further the cam for driving oscillating rotation 115 is engaged with a turret 123 and causes the output shaft for oscillating rotation 125 above thereof to rotate oscillating.

On the outside of this output shaft for oscillating rotation 125, a rotating table 127 is provided on the same shaft through a bearing. On this rotating table 127, an input gear 127a is fixed coaxially. This input gear 127a is engaged with an output gear 121a fixed coaxially on the output shaft for continuous rotation 121, and the continuous rotation of the output shaft for continuous rotation 121 is transmitted to the rotating table 127 (this is also considered as an output shaft, and shall be referred to hereinafter as "output shaft 127").

By such a configuration, the two output shafts 125 and 127 provided on the same shaft are given the task of performing mutually different rotational motions (oscillating rotational motion and continuous rotational motion for the cam apparatus 111). Further, on this cam apparatus 111, by adequately setting the cam curve of the cam for driving continuous rotation 113 and the cam for driving oscillating rotation 115, the continuous rotational motion at a constant speed of the input shaft can be converted and two output shafts aligned on the same shaft can be given the tasks of performing desired rotational motions.

On the cam apparatus 111, however, the rotational motions of the two output shafts 125 and 127 are mutually independent, and these rotational motions cannot be composed into one motion and outputted. Therefore, when the output shaft is caused to perform a compound rotational motion such that the other output shaft is relatively rotated on the basis of the rotational motion, the cam curve becomes so complex that the work of designing the same becomes extremely difficult, requires a high designing capacity and the designing takes a long period of time.

SUMMARY OF THE INVENTION

This invention was made in view of these prior issues and its object is to provide a cam apparatus capable of converting the continuous rotational motion at a constant speed of the input shaft into a compound rotational motion obtained by putting two rotational motions together to drive the output shaft therewith, by means of the cam mechanism having a simple cam curve, as well as a pick and place apparatus using the cam apparatus.

Another object of this invention is to provide a cam apparatus including an input shaft rotatably supported on a housing to be rotated continuously at a constant speed, a first output shaft rotatably supported on the housing and to which rotational motion at an inconstant speed of a specific pattern resulting from the conversion of the continuous rotational motion at a constant speed of the input shaft is transmitted through a rotational motion converting cam mechanism, a slider member provided coaxially to the first output shaft and with freedom of relative displacement along the axial direction through a relative rotation regulating cam mechanism while its relative rotation with the first output shaft is regulated, and to which a reciprocal rectilinear motion in the axial direction of the first output shaft resulting from the conversion of the continuous rotational motion at a constant speed of the input shaft is transmitted through a cam link mechanism, a second output shaft provided coaxially to the first output shaft and rotatably while its movement in the axial direction is regulated, and a motion converting cam mechanism engaged with and between the second output shaft and the slider member, which converts the reciprocal rectilinear motion displacement of the slider member into the oscillating rotational motion displacement of the second output shaft to transmit the same thereto, and transmits the rotational motion at an inconstant speed of the slider member to the second output shaft, wherein the oscillating rotational motion of the slider member and the rotational motion at an inconstant speed of a specific pattern of the first output shaft are compounded and are transmitted to the second output shaft.

Another object of this invention is to provide a pick and place apparatus comprising a cam apparatus including: an input shaft rotatably supported on the housing and continuously driven to rotate at a constant speed, a first output shaft rotatably supported on the housing and to which rotational motion at an inconstant speed of a specific pattern resulting from the conversion of continuous rotational motion at a constant speed of the input shaft is transmitted through a rotational motion converting cam mechanism, a slider member provided coaxially to the first output shaft and with freedom of relative displacement along the axial direction through a relative rotation regulating cam mechanism while its relative rotation with the first output shaft is regulated, and to which a reciprocal rectilinear motion in the axial direction of the first output shaft resulting from the conversion of the continuous rotational motion at a constant speed of the input shaft is transmitted through a cam link mechanism, a second output shaft provided coaxially to the first output shaft and rotatably while its movement in the axial direction is regulated, a motion converting cam mechanism engaged with and between the second output shaft and the slider member, which converts the reciprocal rectilinear motion displacement of the slider member into the oscillating rotational motion displacement of the second output shaft to transmit the same thereto, and transmits the rotational motion at an inconstant speed of the slider member to the second output shaft, in which the oscillating rotational motion of the slider member and the rotational motion at an inconstant speed of a specific pattern of the first output shaft are compounded and are transmitted to the second output shaft; an arm member fixed on the first output shaft and telescopic in the radial direction; and a telescopic driving means that converts the relative rotation generated between the first output shaft and the second output shaft into an expansion or contraction motion of the arm member and transmits as such; wherein the rotational motion at an inconstant speed of the specific pattern of the first output shaft is an intermittent indexing rotational motion, the reciprocal rectilinear motion of the slider member is made while the intermittent indexing rotational motion is stationary, and during the stationary period the arm member expands or contracts at the indexing position.

Still another object of this invention is to provide a pick and place apparatus comprising a cam apparatus including: an input shaft rotatably supported on the housing and continuously driven to rotate at a constant speed, a first output shaft rotatably supported on the housing and to which rotational motion at an inconstant speed of a specific pattern resulting from the conversion of continuous rotational motion at a constant speed of the input shaft is transmitted through a rotational motion converting cam mechanism, a slider member provided coaxially to the first output shaft and capable of relative displacement along the axial direction through a relative rotation regulating cam mechanism while its relative rotation with the first output shaft is regulated, and to which a reciprocal rectilinear motion in the axial direction of the first output shaft resulting from the conversion of the continuous rotational motion at a constant speed of the input shaft is transmitted through a cam link mechanism, a second output shaft provided coaxially to the first output shaft and rotatably while its movement in the axial direction is regulated, a motion converting cam mechanism engaged with and between the second output shaft and the slider member, which converts the reciprocal rectilinear motion displacement of the slider member into the oscillating rotational motion displacement of the second output shaft to transmit the same thereto, and transmits the rotational motion at an inconstant speed of the slider member to the second output shaft, in which the oscillating rotational motion of the slider member and the rotational motion at an inconstant speed of a specific pattern of the first output shaft are compounded and are transmitted to the second output shaft; a snatching means consisting of a pair of snatching arms of which an end is pivotally supported on a base member fixed on the first output shaft; a closing driving means that converts relative rotations generated between the first output shaft and the second output shaft into the unfolding and folding motion of the snatching means and transmits the same; wherein the rotational motion at an inconstant speed of the specific pattern of the first output shaft is an intermittent indexing rotational motion, the reciprocal rectilinear motion of the slider member is made while the intermittent indexing rotational motion is stationary, and during the stationary period the snatching means unfolds and folds at the indexing position.

The objects of this invention other than those mentioned above and the characteristics of two inventions will be made clearer by reading the following detailed description with reference to the attached drawings.

BRIEF DESCRIPTION OF THE DRAWINGS

For a more complete understanding of the present invention and the advantages thereof, reference is now made to the following description taken in conjunction with the accompanying drawings wherein:

FIG. 6 is a time chart for illustrating the operation of the first preferred embodiment and an operating illustration showing the states of its operation;

FIG. 10 is a top plan view showing the pick and place apparatus of the third preferred embodiment according to this invention;

FIG. 11 is an operational illustration showing the pick and place operation of the third preferred embodiment.

DESCRIPTION OF THE PREFERRED EMBODIMENTS

The preferred embodiments of this invention will be explained in detail with reference to the attached drawings.

Figure 1:
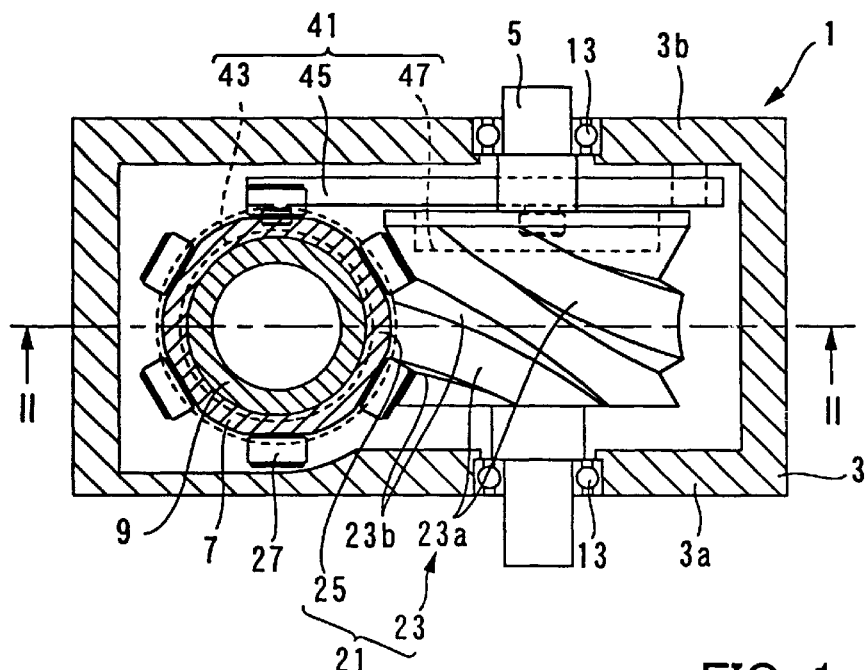
FIG. 1 is a top sectional view of a cam apparatus of the first preferred embodiment according to this invention, and to be more specific it is a sectional view of FIG. 2 taken along the line I—I shown by arrows.
Figure 3:
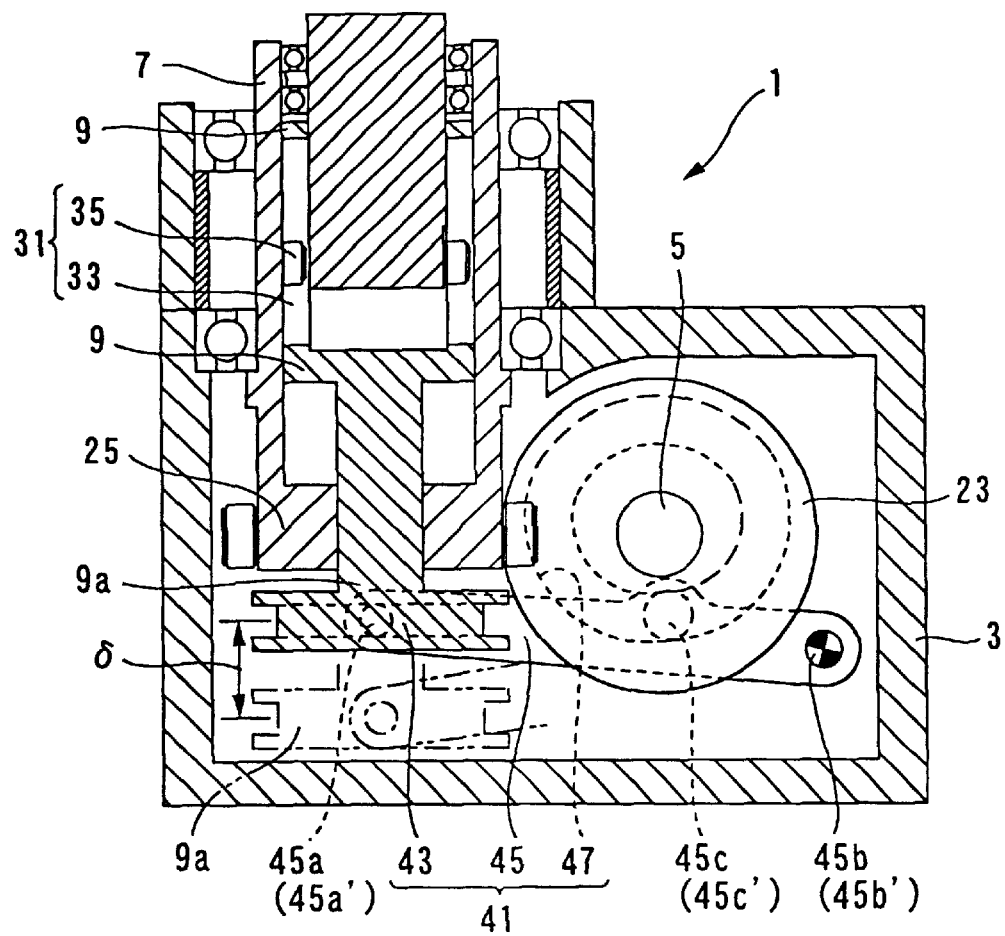
FIG. 3 is a sectional view taken along the line II—II shown by arrows showing a slider member related with the cam apparatus of the first preferred embodiment having displaced to a position different from that of FIG. 2.
Figure 4:
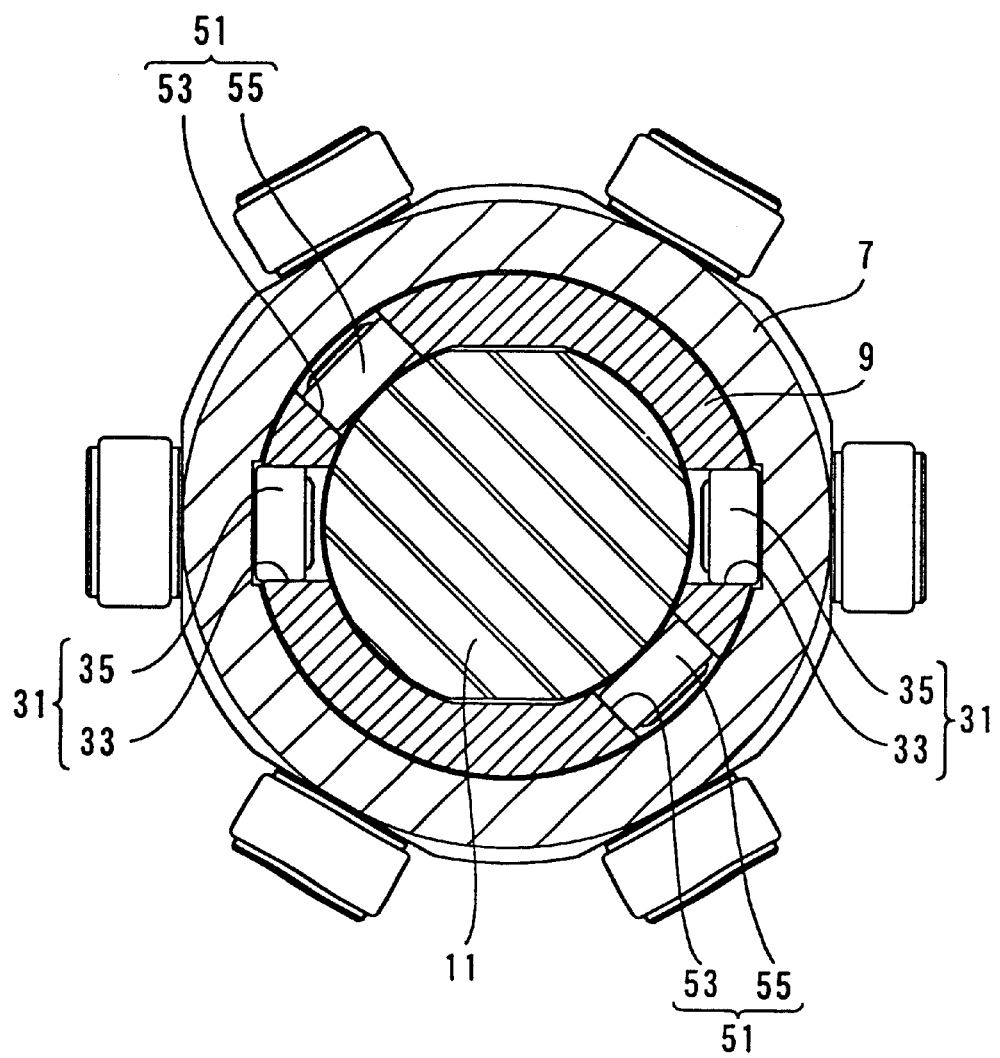
FIG. 4 is a sectional view of FIG. 2 of the first and second output shafts and the slider member taken along the line IV—IV shown by arrows.
Figure 5:
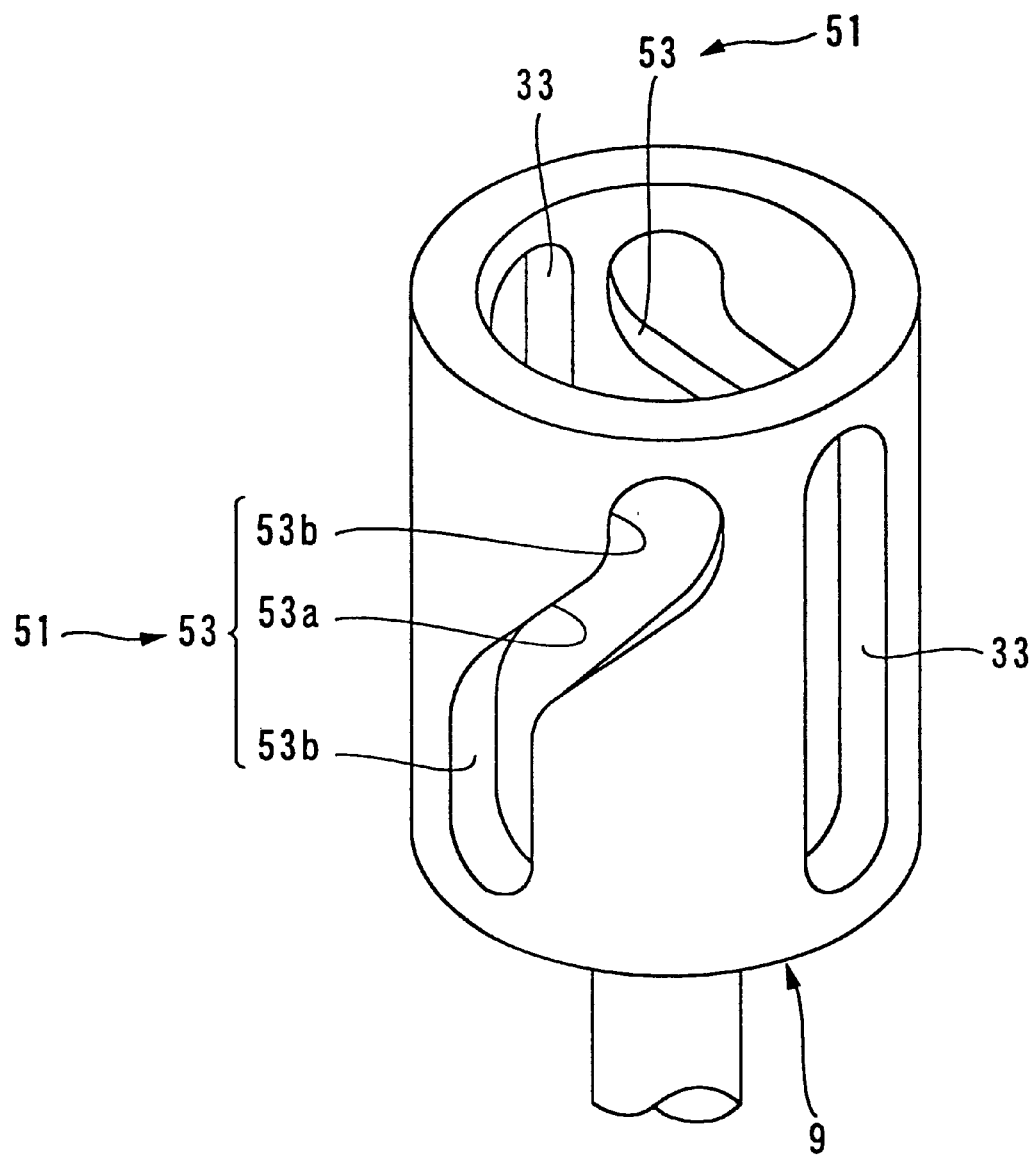
FIG. 5 is a perspective view of the slider member.

FIG. 1 is a sectional view of the cam apparatus of the first preferred embodiment according to this invention. To be more specific, it is a sectional view cut along the line I—I shown by arrows in FIG. 2. FIG. 3 is a sectional view cut along the II—II line shown by arrows showing the displacement of the slider member of the cam apparatus to a position different from that in FIG. 2. FIG. 4 is a sectional view of the first and the second output shafts and the slider member cut along the IV—IV line shown by arrows in FIG. 2. FIG. 5 is a perspective view of the slider member. FIG. 6 is a time chart showing the relationship between the rotational motion of the input shaft, the intermittent indexing rotational motion of the first output shaft, the reciprocating rectilinear motion of the slider member and the oscillating rotation of the second output shaft, as well as the state of the first and the second output shafts corresponding thereto. As regards the cam follower on the inner side of the first output shaft and the cam follower on the outside of the second output shaft shown in FIGS. 2 and 3, however, their actual positional relationship is shown with a discrepancy of a given angle.

The Overall Configuration of the First Preferred Embodiment

Figure 2:
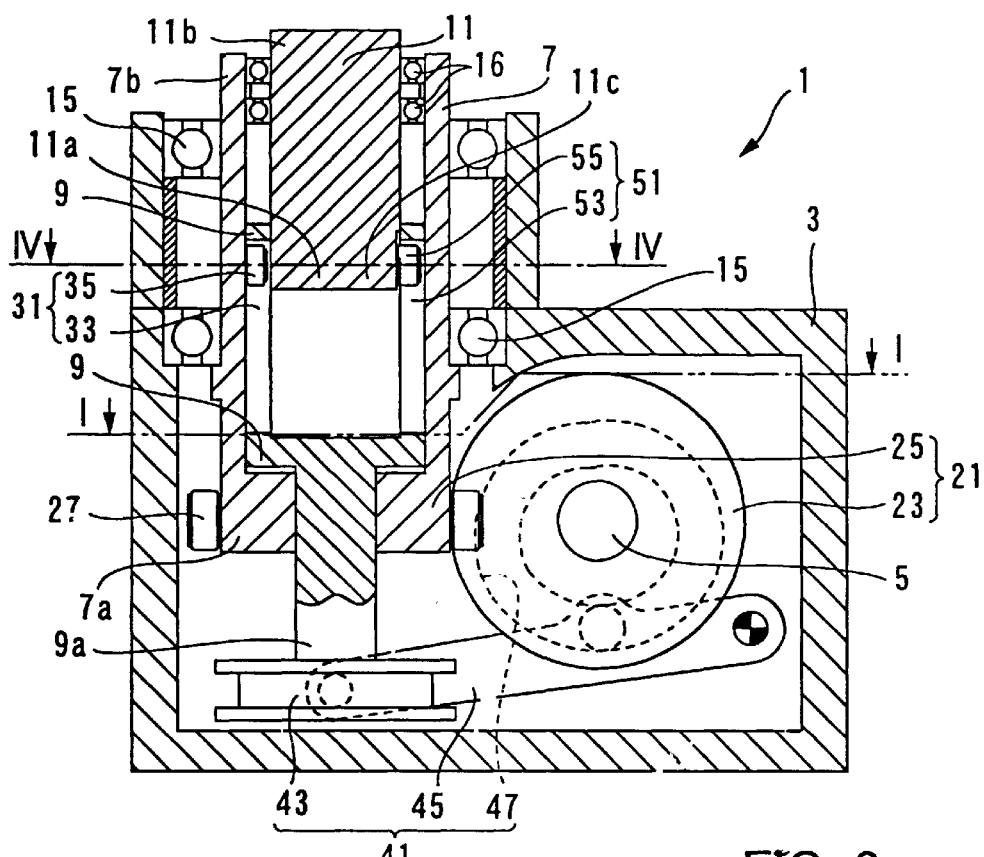
FIG. 2 is a sectional view of FIG. 1 taken along the line II—II shown by arrows.

The cam apparatus 1 of the first preferred embodiment includes, as shown in FIGS. 1 and 2, a hollow box housing 3, an input shaft 5 rotatably supported on this housing 3, a first cylindrical output shaft 7 rotatably rotatably supported on the housing 3 with a twist orthogonal to the input shaft 5, a cylindrical slider member 9 provided coaxially and on the inner side of the first output shaft 7 whose relative rotation with the shaft 7 is regulated, and a second cylindrical output shaft 11 provided coaxially on the first output shaft 7 and on the internal side thereof to pivot rotatably. Then, these shafts 5, 7, 11 and slider member 9 are linked by the cam mechanism and other mechanisms to convert the continuous rotational motion at a constant speed inputted on the input shaft 5 into an intermittent indexing rotational motion which will be outputted on the first output shaft 7, and a compound motion consisting of the intermittent indexing rotational motion and oscillating rotational motion is outputted on the second output shaft 11.

Input Shaft and the First Output Shaft

As shown in FIG. 1, the housing 3 includes an input shaft 5 traversing from a side wall 3a to an opposite side wall 3b. This input shaft 5 is supported rotatably by these side walls 3a and 3b of the housing 3 centering around the shaft through a bearing 13, and is rotationally driven unilaterally at a constant speed and continuously by a source of driving such as a motor. As shown in FIG. 2, on the housing 3 the cylindrical first output shaft 7 whose shaft angles are right angles and separated by a given center distance with the input shaft 5 pivots rotatably through a bearing 15 being centered around the shaft. Then, between substantially the center of the input shaft 5 and one end 7a of the first output shaft 7 in the housing 3, a rotational motion converting cam mechanism 21 is provided so that both may engage, and the continuous rotational motion at a constant speed of the input shaft 5 is converted into the intermittent indexing rotational motion and is outputted onto the first output shaft 7.

This rotational motion converting mechanism 21 includes a globoidal cam 23 fixed coaxially as a driver on the input shaft 5, and a circular turret 25 fixed coaxially as a follower on the end 7a of the first output shaft 7 in the housing 3.

As shown in FIG. 1, on the outer surface of this globoidal cam 23, a taper rib 23a protruding outward in the radial direction is formed, and on both side surfaces a pair of rib surfaces 23b are formed. The input shaft axial position of this taper rib 23a changes along the circumferential displacement around the cam 23. In other words, its axial position of the rib 23a changes depending on the rotational angle of the input shaft 5.

On the other hand, on the outer surface of the turret 25 are rotatably provided six cam followers 27 at every 60° along its rotational direction, and two of them lightly sandwich the taper rib 23a, and remains in oscillating rotation contact respectively on the pair of rib surfaces 23b.

Therefore, following changes in the rotational angle of the input shaft 5, the cam follower 27 displaces towards the input shaft axial direction while shifting relatively on the rib surface 23b, and as a result the turret 25 rotates. Furthermore, the taper rib 23a according to the first preferred embodiment of this invention is formed substantially helically so that, in response to the continuous rotation at a constant speed of the input shaft 5, the turret 25 may perform an intermittent indexing rotational motion consisting of indexing motions and stationing motions, and the first output shaft 7 on which this turret 25 is fixed performs the same intermittent indexing rotations as a result of the continuous rotation at a constant speed of the input shaft 5.

Specifically speaking, an indexing motion consisting of a 60° rotation of the turret 25 to every full rotation of the input shaft 5 as its rotation angle increases, and a stationing motion of stopping the turret 25 for a given period of time are carried out. Then, as the input shaft 5 rotates further, similar indexing and stationing motions are repeated. Furthermore, the first preferred embodiment sets an indexing motion and a stationing motion for every 60° rotation of the turret. However, the pattern of the motions can be regulated suitably depending on the purpose by setting the axial position of the taper rib 23a of the globoidal cam 23, in other words by setting the cam curve and the angle notched for setting the cam followers 27.

Slider Member

As shown in FIG. 3, on the inner side of the first output shaft 7, a cylindrical slider member 9 is coaxially housed. Both of these are tolerated of their relative axial displacement by a relative rotation control cam mechanism 31 created in between them, but their relative rotation centered around the shaft is prohibited. Therefore, the intermittent indexing rotational motion of the first output shaft 7 is transmitted as it is to the slider member 9. Further, between an end 9a of the slider member 9-extruding in the axial direction from the turret 25 of the first output shaft 7 and the input shaft 5, a cam link mechanism 41 is provided to engage both of them. The continuous rotational motion at a constant speed of the input shaft 5 is converted into a reciprocal rectilinear motion in the axial direction of the first output shaft to be outputted to the slider member 9. Therefore, on the slider member 9 a compound motion consisting of an intermittent indexing rotational motion and a reciprocal rectilinear motion in the axial direction is outputted.

A more detailed explanation is as illustrated in FIG. 4. This slider member 9 is engaged coaxially allowing free sliding in the axial direction on the inner side of the first output shaft 7. Then, on this slider member 9 a relative rotation regulating grooved cam 33 constituting one of the cams of the relative rotation regulating cam mechanism 31 is provided. This grooved cam 33 is a rectilinear hole created in the axial direction as shown in FIG. 5, and is formed mutually axisymmetric at two positions of the slider member 9. On the other hand, as shown in FIG. 4, on the inner surface of the first output shaft 7 two pairs of cam followers protruding inwards are provided as relative rotation regulating oscillators 35 constituting the other cams of the relative rotation regulating cam mechanism 31 opposite to the two pairs of grooved cams 33. The introduction of these relative rotation regulating oscillators 35 in the grooved cam 33 and their slidable engagement with the grooved cam 33 operates as a so-called "spline" tolerating a relative displacement in the axial direction while regulating relative rotations between the first output shaft 7 and the slider member 9. Then, this enables the slider member 9 jointly with the first output shaft 7 to proceed to an intermittent indexing rotational motion, and the input of a reciprocal rectilinear motion in the axial direction from the cam link-mechanism 41 mentioned further below enables to displace in the axial direction.

The width of the grooved cam 33 is set such that no slack develops at the time of engagement with the cam follower as the relative rotation regulating oscillator 35 and between both of them. Further, its length is determined by the amount of relative displacement δ between the first output shaft 7 and the slider member 9 due to the cam link mechanism 41 mentioned further below (see FIG. 3), and is set such that the cam follower 35 and the end in the longitudinal direction of the grooved cam 35 do not come into contact and leave a certain gap at the stroke limit of the relative displacement.

Furthermore, as shown in FIG. 5, a grooved cam for driving oscillating rotation 53 constituting one of the cams of the motion converting cam mechanism 51 is formed at a point between the two pairs of grooved cams 33 on the slider member 9. This will be explained further below.

As shown in FIG. 3, the cam link mechanism 41 that causes the slider member 9 to displace reciprocally in the axial direction consists of an annular engaging groove 43 integrally formed in the form of a ring outside one end 9a of the slider member 9 protruding from the end portion of the first output shaft 7, an oscillating arm 45 where the point of action 45a of which is slidably engaged with the annular engaging groove 43 and the support point 45b of which is rotatably supported on the housing 3, and an end grooved cam 47 formed at the end surface of the globoidal cam 23 and with which the point of force 45c of the oscillating arm 45 is slidably engaged.

At one end of this oscillating arm 45 is provided a cam follower 45a'. It is slidably engaged with the annular engaging groove 43 as the point of action 45a. At the other end a support shaft 45b' is provided and is rotatably supported on the housing 3 as the support point 45b. Further, between the one end and the other end a cam follower 45c' is provided. It is engaged with the end grooved cam 47 as the point of force 45c, and this end grooved cam 47 functions as a driver and the oscillating arm 45 as a follower.

This end surface grooved cam 47 is a groove continuously incised without end at the end surface of the globoidal cam 23. Taking into account the reciprocal rectilinear motion displacement of the slider member 9 so that the operating characteristic of the time chart mentioned below would be effectively demonstrated, the distance between the axial center of the grooved cam 47 and that of the globoidal cam 23 is set. Then, as a result of the rotation of this globoidal cam 23, the position of the cam follower 45c' engaged with this grooved cam 47 displaces in the axial direction of the slider member 9. Therefore, the oscillating arm 45 oscillates centered around the support shaft 45b', and this oscillation causes the slider member 9 to which the cam follower 45a' is engaged to start reciprocal rectilinear motions in its axial direction.

The Second Output Shaft

As shown in FIGS. 2 and 4, the slider member 9 houses inside, the cylindrical second output shaft 11 disposed coaxially to this slider member 9, and this second output shaft 11 is coaxially and rotatably supported on the first output shaft 7 along the shaft center through such as the bearing 16. The slider member 9 and the second output shaft 11 are engaged through the intermediary of a motion converting cam mechanism 51, and the reciprocal rectilinear motions in the axial direction of the slider member 9 are converted into the relative oscillating rotational motions to the slider member 9 and are outputted to the second output shaft 11. Therefore, the intermittent indexing rotational motions of the slider member 9 to which the oscillating rotational motions of the same are superposed are outputted on the second output shaft 11.

A detailed explanation is as follows. As shown in FIG. 2, a portion 11a on the housing side of this second output shaft 11 is engaged with the inner side of the slider member 9. Further, the portion 11b protruding outwards from the slider member 9 to the outside of the housing 3 is supported by the inner surface of the other end 7b of the first output shaft 7 through the bearings 16 provided on the outside of the protruding part 11b, and therefore the second output shaft 11 is rotatable coaxially to the first output shaft 7 about the shaft center, but can make no relative displacement in the axial direction.

On the outside of one end 11c on the housing side of this second output shaft 11, a cam follower as an oscillator for driving oscillating rotation 55 constituting the other cam of the motion converting cam mechanism 51 protruding outwards is provided, and introduces itself in the grooved cam for driving oscillating rotations 53 constituting one of the cams formed on the slider member 9 to be engaged slidably therewith.

This grooved cam 53, as shown in FIG. 5, consists of a helical through hole section 53a formed helically having a given displacement angle along the axial direction and a linear through hole section 53b extended linearly in the axial direction from the top and rear ends thereof. The grooved cams 53 are located between the two pairs of grooved cams for regulating relative rotation and are formed mutually axisymmetric at two points. When the reciprocal rectilinear motion of the slider member 9 results in a relative displacement in the axial direction between the slider member 9 and the second output shaft 11, the second output shaft 11 makes a relative rotation with respect to the slider member 9, for a displacement angle corresponding to the amount of such relative displacement.

The width of the grooved cam 53 is set in such a way that no slack develops at the time of engagement with the cam follower as the oscillator for driving oscillating rotation 53 and between both of them. Further, its displacement angle is set conveniently depending on the oscillating rotation angle of the second output shaft 11, and the linear through hole section 53b is set in such a way that the cam follower and the abutted end surface in the axial direction of the linear through hole section 53b may not come into contact and leave a certain gap at the stroke limit of the relative displacement in the axial direction of the slider member 9.

Operation of the First Preferred Embodiment

The operation of the cam apparatus according to the first preferred embodiment will be explained below.

FIG. 6 is a time chart showing the relationship among the rotational motion of the input shaft, the intermittent indexing rotational motion of the first output shaft, the reciprocal rectilinear motion of the slider member and the oscillating rotational motion of the second output shaft, and an operating illustration of the corresponding state of the first and the second output shafts. Furthermore, the horizontal axis of the time chart represents the rotation angle of the input shaft, while the vertical axis represents respectively from the top downwards the rotation angle of the first output shaft and the slider member, the relative displacement amount in the axial direction of the slider member, and the relative rotation angle of the second output shaft to the first output shaft (the slider member).

In this operating example, a round of the input shaft, in other words a rotation angle of 360° is considered as one cycle of the operation.

Within a range of 0° to 90° for the rotation angle of the input shaft, the first output shaft rotates up to 60° in direct proportion to the rotation angle by the rotational motion converting cam mechanism. In that case, the slider member is denied by the relative rotation regulation cam mechanism any possibility of making any relative rotation with the first output shaft. Therefore, the slider member and the second output shaft rotate in common up to 60° together with the first output shaft. During this period of time, however, the slider member makes no relative displacements as set in the curve for the end surface grooved cam and therefore the second output shaft does not rotate relative to the first output shaft.

In the range of 90° to 360° for the rotation angle, the first output shaft will be stationary, in other words it will maintain the rotation angle of 60°. On the other hand, in the rang of 90° to 180°, the slider member displaces relatively in the axial direction in direct proportion to the rotation angle of the input shaft, and this rotational displacement is converted into the relative rotational displacement of the second output shaft by the motion converting cam mechanism, and the second output shaft rotates relatively by a given angle. A little after the beginning of the relative displacement of the slide member the second output shaft starts rotating relatively, and stops performing this relative rotation in advance before the moment when the stroke limit for the relative displacement is reached because linear through holes are created at the top and rear ends of the grooved cam for driving oscillating motion of the motion converting cam mechanism.

In the subsequent 180° to 270° range, the slider member stops at the stroke limit of relative displacement, to thereby maintain the relative rotation of the second output shaft to the given angles. Then, within a range of 270° to 360°, following the rotation of the input shaft, the relative displacement of the slider member in the axial direction is restored, and as a result relative rotation resumes by following inversely the relative rotational motion in the range of 90° to 180°, and when the rotation angle of the input shaft reaches 360°, the relative rotation angle of the second output shaft returns to 0° and one cycle is completed.

In the second cycle that follows, in other words in the following first rotation of the input shaft, the state of the first output shaft having rotated 60° is considered as the initial state and the cycle is repeated. In other words, the first output shaft, the slider member and the second output shaft rotate up to 120°, and while they remain stationary at that position, the relative displacement of the slider member in the axial direction kicks off the relative rotation and the resumed rotation of the second output shaft. Thereafter, all of the first output shaft, the slider member and the second output shaft repeat these motions and integrally start indexing rotation by a unit of 60°, and while they remain stationary, the second output shaft starts relative oscillating rotation in respect to the first output shaft.

In this way, the continuous rotation at a constant speed of the input shaft kicks off the rotational motion at an inconstant speed of a specific pattern of the first output shaft, and enables the second output shaft to start a compound rotational motion consisting of the rotational motion at an inconstant speed and oscillating rotational motion.

The Second Preferred Embodiment

Figure 7:
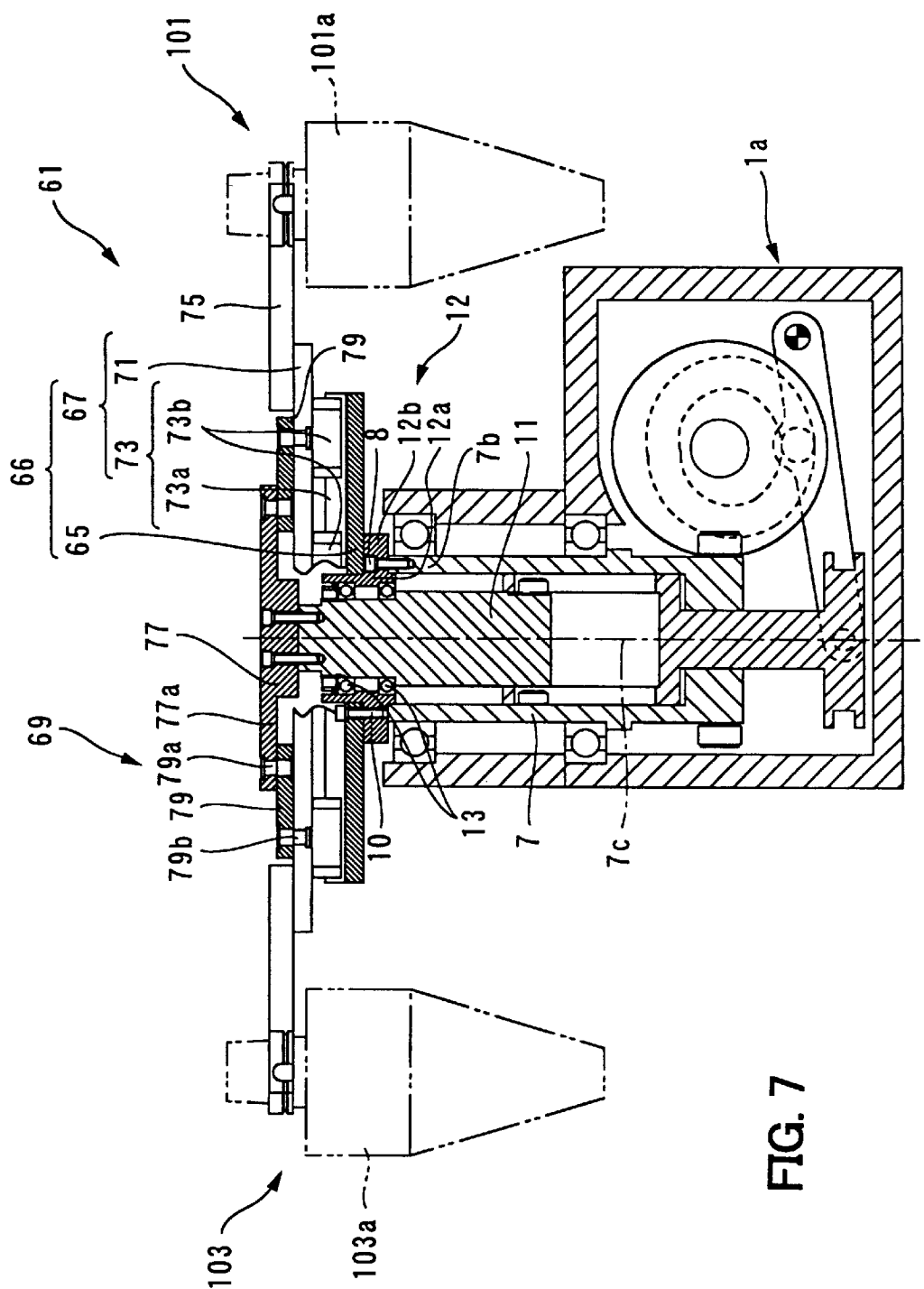
FIG. 7 is a partially broken sectional view showing a pick and place apparatus of the second preferred embodiment according to this invention.
Figure 8:
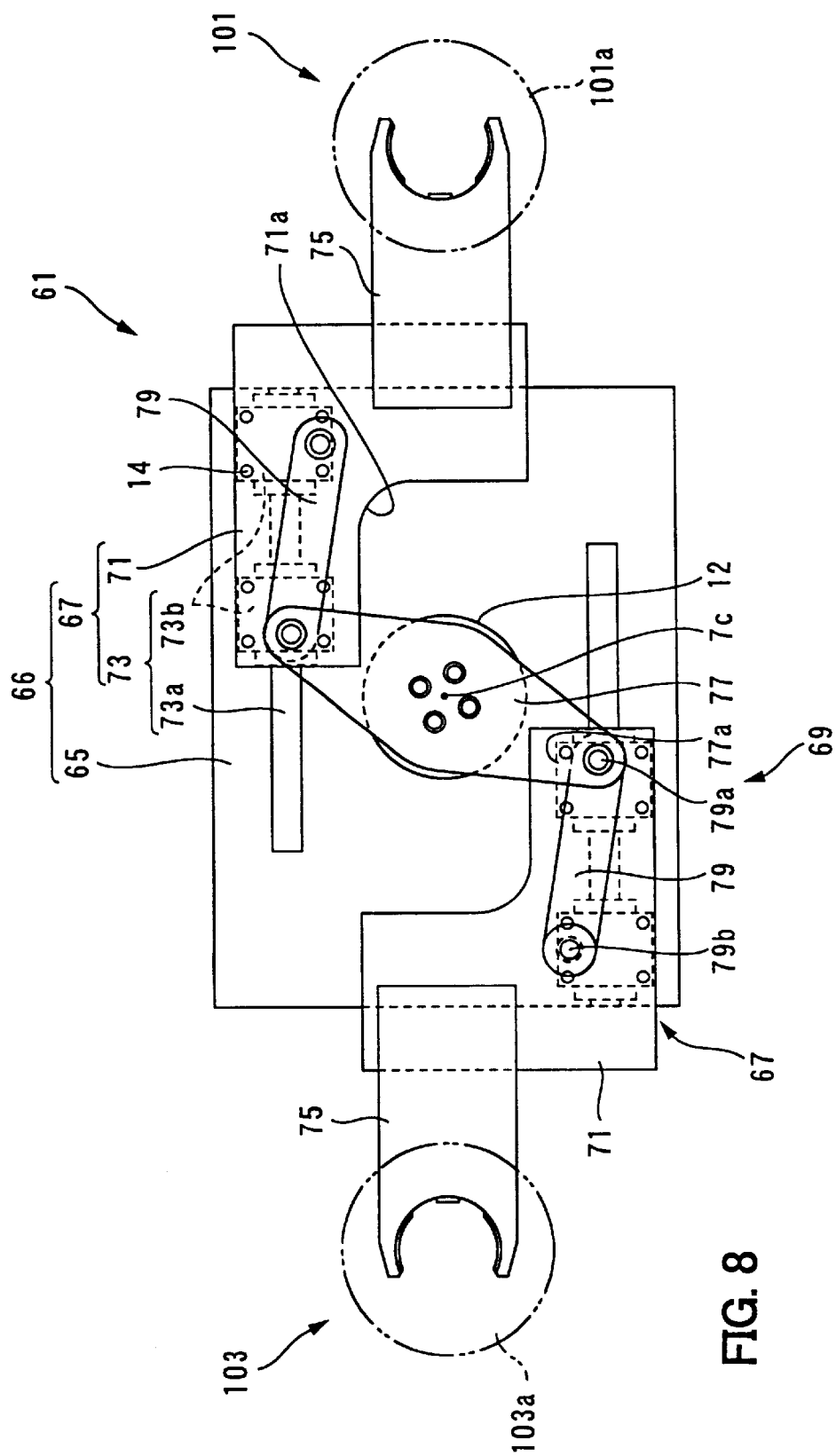
FIG. 8 is a top plan view showing the pick and place apparatus according to the second preferred embodiment.
Figure 9:
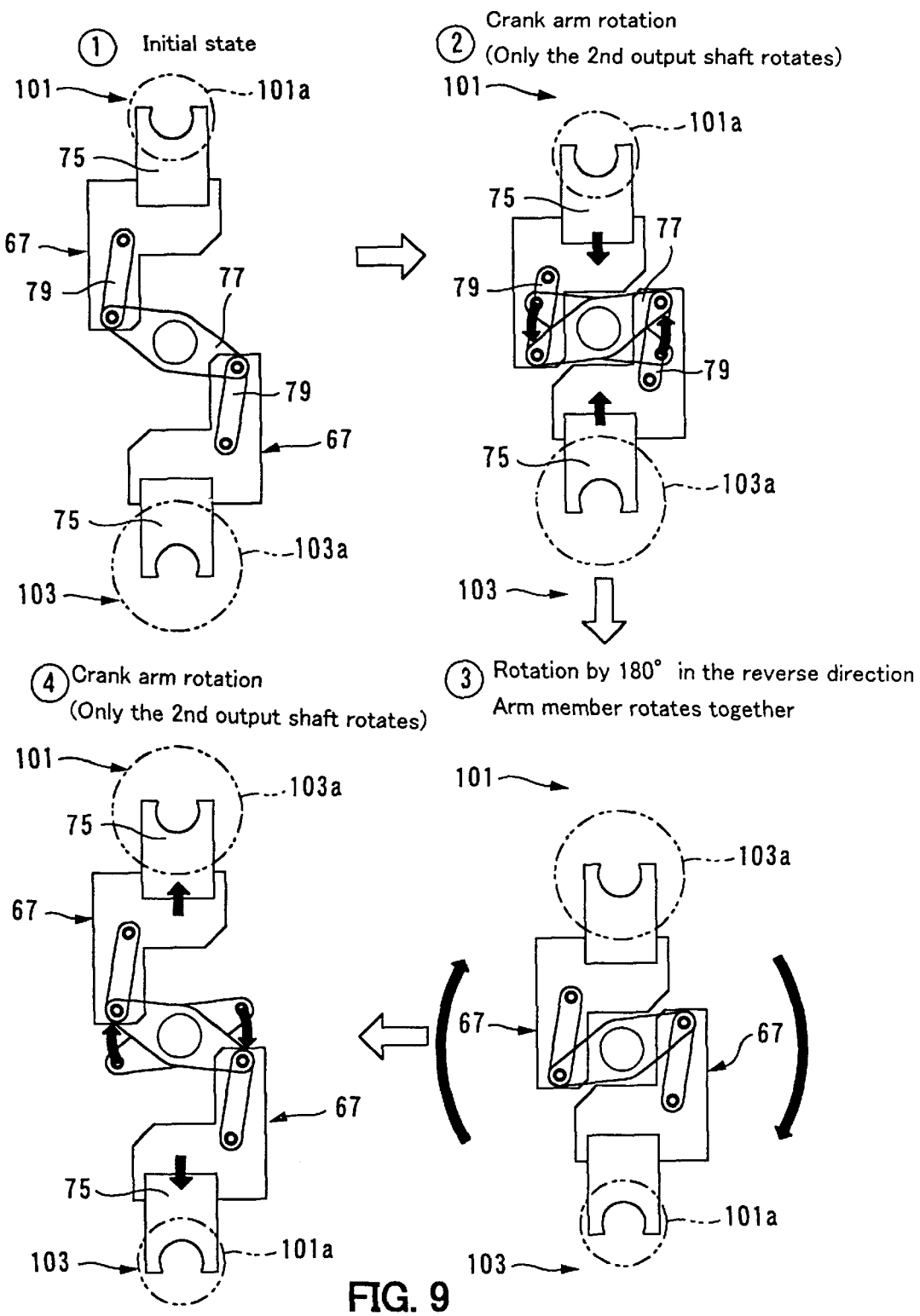
FIG. 9 is an operational illustration showing the pick and place operation of the second preferred embodiment.
Figure 12A:
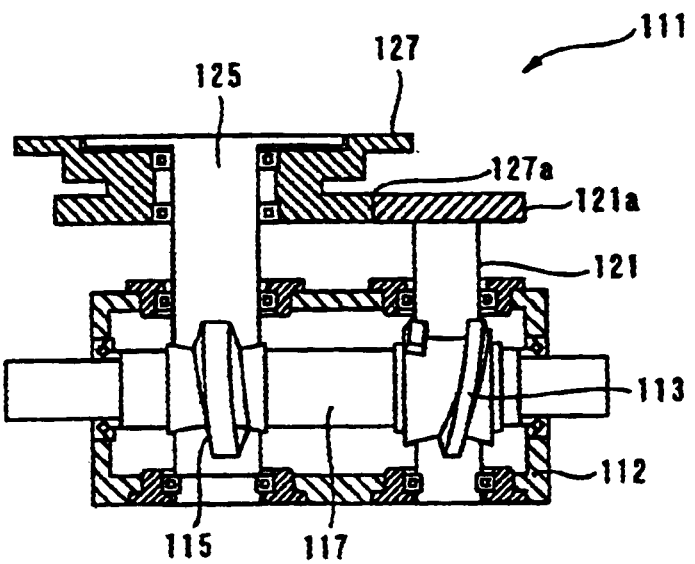
FIG. 12 is a side and top sectional view of a conventional cam apparatus.
Figure 12B:
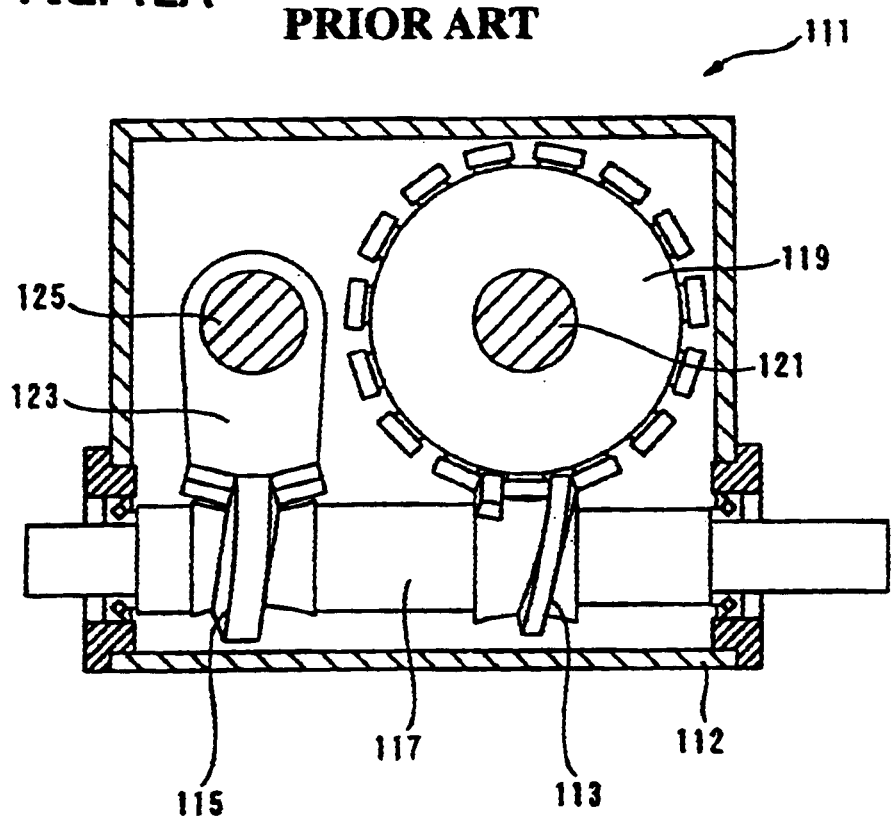

FIG. 7 is a partially broken sectional view of a pick and place apparatus according to the second preferred embodiment of this invention, and FIG. 8 is a plan view thereof. FIG. 9 is an operating illustration showing the pick and place operation of the second preferred embodiment according to this invention.

This pick and place apparatus 61 is, as shown in FIGS. 7 and 8, installed in the midway of two work piece delivery positions 101 and 103, and is an apparatus for exchanging simultaneously works 101a and 103a delivered to these delivery positions 101 and 103 respectively to the delivery positions 101 and 103. This exchange operation consists of two work snatching means 75 of this pick and place apparatus 61 extending mutually in a reverse direction towards the delivery positions 101 and 103 and approaching the works 101a and 103a located at these positions, then receiving the works 101a and 103a from delivery equipments not illustrated respectively, next contracting and making a 180° turn at a place separated from the delivery positions 101 and 103, extending again and approaching the delivery positions 101 and 103, and at these positions delivering the works 101a and 103a to the delivery devices. In order to make this exchange operation by the input of a single continuous rotation at a constant speed, the cam apparatus 1 of the first preferred embodiment is applied. The cam apparatus 1a of the second preferred embodiment, however, is somewhat different from the first preferred embodiment in that the number of cam followers of the turret and the cam curve of the globoidal cam is set in such a way that the indexing motion of the first output shaft may be executed by a unit of 180° and also in the support structure for the second output shaft.

As shown in FIG. 7, this pick and place apparatus 61 includes the cam apparatus 1a fixed on a base such as a machine base, arm members 66 fixed on the end 7b of the first output shaft 7 of this cam apparatus 1a which are telescopic in the axial direction, and a telescopic driving means 69 installed between these arm members 66 and the second output shaft 11 to convert the relative rotation generated between this second output shaft 11 and the first output shaft 7 to drive the expansion and contraction of the arm members 66.

The cam apparatus 1a is disposed in such a way that the axial center 7c of its first output shaft may be positioned midway of the two delivery points 101 and 103. Inside the end 7b of its first output shaft 7, a sleeve 12 fits coaxially, and one end of the sleeve 12 protrudes from the end 7b.

On the outside of this protruding section 12a is provided an annular collar section 12b larger than the outer diameter of the first output shaft 7. The back surface thereof abuts the end surface of the first output shaft 7 and is fastened firmly by bolts 8. Further, on the inside of this sleeve 12 is provided a bearing 13 which supports rotatably the second output shaft 11 coaxially with the first output shaft 7.

The arm members 66 are provided on the fixed arm 65 whose back surface is fixed on the sleeve 12 and on the surface of this fixed arm 65. They consist of two pairs of movable arms 67 which are mobile mutually in the opposite directions along the axial direction of the first output shaft 7. By the forward and backward movements of these mobile arms 67 on the fixed arms 65, the arm members 66 expand and contract.

The fixed arms 65 are plates with a round hole of the same diameter as the outer diameter of the sleeve 12 in the center. The sleeve 12 fits this round hole, allowing the surface of the collar section 12b to come into contact with the circumference of the round hole, which are then fastened firmly by bolts 10. Therefore, these fixed arms 65 are integral with the first output shaft 11, and they join with the first output shaft in their intermittent indexing rotation by a unit of 180°.

As FIGS. 7 and 8 show, on the surface of these fixed arms 65, the two pairs of mobile arms 67 are provided at points mutually symmetric with reference to the axial center of the first output shaft 7c, and these two pairs of mobile arms 67 include respectively a slide plate 71 provided with snatching means 75 for snatching works 101a and 103a, and a linear guide 73 for guiding this slide plate 71 freely with forward and backward movements while supporting the same on the fixed arms 65.

The rails 73a of this linear guide 73 are fixed on the surface of the fixed arms 65 in such a way that the rail axes may be parallel to the forward and backward motion direction, and at the same time, disposed at a given center distance by the side of the sleeve 12 of the first output shaft so that the forward and backward motion stroke may be large enough. On the surface of a bearing block 73b engaged with a freedom of relative displacement along this rail 73a is firmly fastened on the backside of the slide plate 71 by bolts 14, and this slide plate 71 is made in such a way that or displacement to the outward direction along the axis of the first output shaft as a the forward motion and the backward motion or displacement to the inward direction may be made freely.

This slide plate 71 is an L shaped plate viewed from above and is notched so that it may not interfere with the sleeve 12 at the limit of backward displacement, and the notched section 71*a* will accommodate the sleeve 12 at the limit of backward displacement. At the end in the forward displacement direction of this slide plate 71 is provided the snatching means 75 of the works 101*a* and 103*a*. This snatching means 75 is disposed at a position where the straight line linking the axial center 7*c* and the snatching means 75*c* is parallel with the rail 73*a* so that the snatching means 75 may displace on the same straight line as before even when the snatching means has rotated 180° around the axial center 7*c* of the first output shaft. Since the snatching means 75 of the other mobile arm 67 is disposed at a similar position, these snatching means 75 and the axial center 7*c* result in being positioned on the straight line.

Furthermore, in this preferred embodiment, the snatching means 75 is designed to move forward and backward on a same straight line before and after the 180° revolution. However, the position of this snatching means 75 may be adjusted so that before and after the 180° revolution the snatching means 75 may displace on a different parallel straight line. These positions will be determined by the positional relationship between the two delivery positions 101 and 103.

The telescopic driving means 69 includes a crank arm 77 the central section of which is fixed and both ends of which extends linearly outwardly in the radial direction from inside the sleeve 12 to the end surface of the second output shaft 11 protruding outwards of the housing 3, and a cone rod 79 of which one end 79*a* is fixed to the top end 77*a* of this crank arm 77 through a crank pin. The other end 79*b* of this cone rod 79 is fixed by a crank pin at any position outward from the fixed position 79*a* on the slide plate 71. This cone rod 79 is provided respectively to each of the two pairs of slide plates 71. At the limit of backward displacement of the mobile arm 67, the crank arm 77 and the cone rod 79 are bent at the point of fixation 79*a,* and the angle they form is small. However, as the crank arm 77 rotates, the rotating force is transmitted to the slide plate 71 through the cone rod 79, the angle grows larger and the flexion is straightened out, and the slide plate 71 starts a forward displacement motion. Further, on the contrary the backward rotational motion of the crank arm 77 transmits the backward rotation force, the angle becomes smaller and bent, and the slide plate 71 starts a backward displacement motion.

Incidentally, in this second preferred embodiment, the point of fixation 79*b* of the cone rod 79 and the slide plate 71 is chosen at any point on the slide plate 71 outwards from the point of fixation 77*a* of the cone rod 79 with the crank arm 77. This does not apply, however, if the cone rod 79 and the slide plate 71 are bent at the limit of backward displacement. Further, on the contrary, even when it is set at the limit of backward displacement, the mobile arms 67 can start forward and backward motions. It is needless to say further that with regards to the two pairs of cone rods 79, their respective position of fixation is set at a symmetrical point with reference to the first output shaft 7.

Now, the operation of the pick and place apparatus 61 of this preferred embodiment will be described below.

FIG. 9 is a plan view of this pick and place apparatus, and is schematized to such an extent that its operation may be understood.

(1) First, as the initial state, the fixed arm 65 stays stationary at the indexing position and during this stationing the normal rotational motion of the second output shaft causes the crank arm 77 to rotate in the positive direction, the flexion between the crank arm 77 and the cone rod 79 is somewhat straightened, the snatching means 75 of the mobile arm 67 moves forward to the works delivery positions 101 and 103 to receive the works 101*a* and 103*a* from the equipments of delivery not illustrated.

(2) The reverse operation of the second output shaft reverses the operation of the crank arm 77, and as a result the crank arm 77 and the cone rod 79 are bent, the snatching means 75 retreats backwards and the works 101*a* and 103*a* are carried to the proximity of the axial center of the second output shaft.

(3) The intermittent indexing rotation of the first output shaft causes the fixed arm (not illustrated) together with the mobile arms 67 to rotate 180°, to reverse and become stationary. This causes the works 101*a* and 103*a* snatched by the mobile arms 67 to be respectively exchanged at the delivery positions 103 and 101 side.

(4) The normal rotational motion of the second output shaft during this stationing causes the snatching means 75 to advance to the works delivery positions 101 and 103, where the works 103*a* and 101*a* are delivered to the delivery equipments not illustrated, and the subsequent work pieces are received. Then, the process returns to the step (1), and similar exchange operations are repeated.

The Third Preferred Embodiment

FIG. 10 is a plan view showing a pick and place apparatus of the third preferred embodiment according to this invention, and FIG. 11 is a operating illustration showing its pick and place operation.

This pick and place apparatus 81 is an apparatus provided with a same cam apparatus (not illustrated) as that of the second preferred embodiment, installed midway between the two works delivery positions 105 and 107 and designed to exchange at the same time the work pieces 105*a* and 107*a* assigned at the delivery points 105 and 107 respectively to the delivery positions 105 and 107. The basic configuration is the same as that of the second preferred embodiment. Therefore, only the differences with the second preferred embodiment will be explained.

The pick and place apparatus 81 of the third preferred embodiment is different from the second preferred embodiment in that the cam apparatus is not used as the driving source of the expansion and contraction motion of the work snatching means, in other words as the driving source of forward and backward motions, but it is used as the driving source of snatching motion of the work snatching means. That is, in the third preferred embodiment the snatching means is manipulated to unfold and fold by the oscillating rotation of the second output shaft of the cam apparatus to snatch and release work pieces.

As shown in FIG. 10, this pick and place apparatus 81 includes a cam apparatus (not illustrated) disposed in such a way that the axial center 7*c* of the first output shaft 7 may be midway between the two delivery points 105 and 107, a base member 85 of which the backside is fixed through the sleeve (not illustrated) at the end of the housing of the first output shaft 7, two pairs of snatching means 87 provided mutually in the opposite direction sandwiching the first output shaft 7 on the surface of this base member 85, and an opening and closing driving means 89 provided between these snatching means 87 and the second output shaft 11, which converts the relative rotation generated between this second output shaft 11 and the first output shaft 7 to unfold and fold the snatching means 87.

On the sleeve of the first output shaft (not illustrated), the base member 85 is firmly fastened in place of the fixed arms of the second preferred embodiment, and this base member 85 works integrally with the first output shaft to start an intermittent indexing rotation by the unit of 180°. On the side surface of the second output shaft 11 protruding from the central round hole of this base member 85 is firmly fastened a rotating disk 91 coaxially with the second output shaft 11 in place of the crank arm.

On the surface of this base member 85, two pairs of snatching means 87 are provided point symmetrically in respect to the axial center 7c of the first output shaft 7, and these two pairs of snatching means 87 consist respectively of a pair of long and slender snatching arms 82 and 84 rotating in parallel to the surface and is rotatably supported on the base member 85 through a pin 86. The pivoting position of this pair of snatching arms 82 and 84, in other words the positions of support points by the pin 86 are closer to the delivery position side than the axial center 11d of the second output shaft, and the position 86 of support point for each snatching arm 82 and 84 is mutually line symmetrical with reference to the line linking the centers of delivery points 105b and 107b and the axial center 11d of the second output shaft. Each of them rotates using the pin 86 as their support points, and by these snatching arms 82 and 84 they can pinch and snatch the work pieces 105a and 107a placed at the delivery points 105 and 107.

The opening and closing driving means 89 includes the rotating disk 91 fixed on the second output shaft 11, and bar-type cone rods 93, 95 of which an end is rotatably fitted on the rotating disk 91 through a crank pin and another end is fixed rotatably on the snatching arms 82 and 84 through a crank pin, to transmit the rotating power of the rotating disk 91 to the snatching arms 82 and 84. These cone rods 93 and 95 are provided respectively to each of the snatching arms 82 and 84.

For a cone rod 93 fitted rotatably on a snatching arm 82 among a pair of snatching arms 82 and 84, the rotatable fitting point 93a with this snatching arm 82 is set closer to the delivery position side than the support point 86 of the snatching arm 82, and the rotatable fitting point 93b with the rotating disk 91 is also set closer to the delivery position side than the axial center 11d of the rotating disk 91. For this reason, this cone rod 93 transmits the rotating power of the rotating disk of the same direction as that of the rotating disk 91 to the snatching arm 82, and the snatching arms 82 also rotates in the same direction as that of the rotating disk 91.

On the other hand, for a cone rod 95 fitted rotatably on the other snatching arm 84, the point of rotatable fitting 95a with this snatching arm 84 is set on the opposite side of the delivery position side to the support point 86 of the snatching arm 82, and the point of rotatable fitting 95b with the rotating disk 91 is set on the delivery position side than on the axial center 11d of the rotating disk 91. Therefore, this cone rod 95 changes the rotating direction of the rotating disk 91 to the opposite direction and transmits the result to the snatching arm 84. Thus, the snatching arm 84 rotates in the opposite direction from the rotation of the rotating disk 91.

Therefore, the rotation of the rotating disk 91 leads the one pair of snatching arms 82 and 84 to rotate in the opposite direction to each other. Thus, a pair of snatching arms 82 and 84 can unfold and fold and therefore snatch and release work pieces 105a and 107a placed at the delivery positions 105 and 107.

In other words, as shown in FIG. 10B, as a result of the outward trip portion of oscillating rotation of the second output shaft 11 followed by the positive rotation of the rotating disk 91, the snatching arm 82 rotates in the same direction as this rotation and the other snatching arm 84 rotates synchronously in the opposite direction, and they pinch and snatch the work pieces 105a and 107a. As shown in FIG. 10A, when by the return rotation the rotating disk 91 begins to rotate in the opposite direction, the snatching arms 82 and 84 rotate in the opposite direction and release the work pieces 105a and 107a.

Furthermore, it is needless to say that the positions of the points of rotatable fitting will be adjusted so that a pair of snatching arms 82 and 84 may rotate asymmetrically regarding the above-mentioned line segment.

Now, the operation of the pick and place apparatus 81 according to the third preferred embodiment will be explained. FIG. 11 is a top plan view showing the operation of this pick and place apparatus and is schematized to such an extent that its operation is understandable.

(1) As the initial state, delivery equipments not illustrated have distributed work pieces 105a and 107a to the delivery positions 105 and 107. Further, two pairs of snatching means 87 of the pick and place apparatus stay stationary respectively at their indexing positions, and a pair of snatching arms 82 and 84 of each snatching means 87 are in the unfolded state.

(2) During this period of stationing, the positive rotation of the second output shaft causes the rotating disk 91 to rotate in the positive direction, and each snatching means 87 folds and snatches each of the work pieces 105a and 107a placed at the delivery positions 105 and 107.

(3) After snatching the work pieces, the intermittent rotation of the first output shaft causes the base member 85 on which the snatching means 87 is provided to start an indexing rotation by 180° to carry the work pieces 105a and 107a to their respective delivery positions 107 and 105 and then to stop.

(4) During stationing, due to the operation in the opposite direction of the second output shaft, the rotating disk 91 starts to rotate in the opposite direction, and each snatching means 87 unfolds and delivers the work pieces 107a and 105a at the respective delivery positions 105 and 107. Then, in the fully unfolded state, the delivery equipments not illustrated exchange the work pieces, and the process returns to step (1).

These are explanations on the preferred embodiments of this invention. This invention, however, is not limited to these embodiments, and the following variations are possible to the extent that they do not deviate from the purpose of the invention.

(a) In this first preferred embodiment, grooved cams for regulating relative rotations in the form of through holes piercing through the slider member and grooved cams for driving oscillating rotation are formed. However, this is not limitative provided that oscillators for regulating relative rotations and oscillators for driving oscillating rotation can be engaged free to oscillate therewith, and they can be formed in the concave form instead of piercing through. In other words, the grooved cams for regulating relative rotation may be formed in a linear concave section along the axial direction on the outer surface of the slider member, and the grooved cams for driving oscillating rotation may be formed on a helical concave section having a given displacement angle along the axial direction at the inner surface of the slider member. Incidentally, if it is possible in this case to set such grooved cams to the extent that the sum of the depth of the concave portions does not exceed the thickness of the slider member, each concave portion does not pierce through, and therefore the grooved cams can be freely set without worrying about the positions of each grooved cam. For example, helical concave portions of the grooved cam for driving oscillating rotation can be formed continuously on the entire outer surface of the slider member, and the limit of oscillating rotation angle of the second output shaft can be set at a large value.

(b) In this first preferred embodiment, the grooved cam for driving oscillating rotation on the slider member is formed by a helical through hole and a linear through hole extended from the top and the rear end thereof. But this is not limitative, a plurality of helical through holes may be chained to form such grooved cam, or this may be formed in a zigzag of V or W shapes in respect to the axial direction. In this case, the slider member may take a rectilinear motion in one direction and the second output shaft may take oscillating rotation.

(c) In this first preferred embodiment, the end surface grooved cam of the cam link mechanism was integrally formed at the end surface of a globoidal cam. This is not limitative provided that it is formed coaxially with the globoidal cam and is incised in the same form as the end surface grooved cam with respect to the shaft, and an end surface grooved cam may be formed on a different member from the globoidal cam. For example, a round disk member provided coaxially with a globoidal cam and facing the end of the globoidal cam may be provided on the input shaft, and a groove of the same form as the end surface grooved cam with respect to the input shaft may be incised on the surface opposite to the round disk member, and this may be used as an end surface grooved cam.

As described above, this preferred embodiment is in accordance with an input shaft rotatably supported on the housing and driven to rotate continuously at a constant speed, the first output shaft rotatably supported on the housing and to which a rotation motion at an inconstant speed of a specific pattern resulting from the conversion of the continuous rotation motion at a constant speed of the input shaft is transmitted through a rotation motion converting cam mechanism, a slider member provided coaxially to the first output shaft and with freedom of relative displacement along the axial direction being subjected to a restriction on its relative rotation with the first output shaft through a relative rotation regulating cam mechanism and to which the reciprocal rectilinear motion in the direction of the first output shaft resulting from the conversion of the continuous rotation motion at a constant speed of the input shaft through a cam link mechanism is transmitted, the second output shaft provided coaxially to the first output shaft and rotatably being subjected to a restriction on displacement in the direction of the shaft, a motion converting cam mechanism engaged with and intervened by the second output shaft and the slider member, which converts the reciprocal rectilinear motion displacement of the slider member into the oscillating rotation motion displacement of the second output shaft and transmits the result to the second output shaft and at the same time transmits the rotation motion at an inconstant speed of the slider member to the second output shaft, and the transmission to the second output shaft of a compound motion resulting from compounding the oscillating rotation motion of the slider member and the rotation motion at an inconstant speed of a specific pattern of the first output shaft.

Such a cam apparatus converts the continuous rotation at a constant speed of the input shaft into a rotation motion at an inconstant speed of a specific pattern through the rotation motion converting cam mechanism and transmits the result to the first output shaft, and the first output shaft rotates at an inconstant speed.

The slider member provided on this first output shaft through the relative rotation regulating cam mechanism, being subjected to a restriction on relative rotation with the first output shaft, starts the rotation motion at an inconstant speed integrally with the first output shaft. Since the slider member is provided on the first output shaft with a complete freedom of relative displacement in the direction of the output shaft, and the continuous rotation motion at a constant speed of the input shaft is converted into the reciprocal rectilinear motion in the axial direction of the slider member through a cam link mechanism and the result is transmitted thereto, the slider member starts a reciprocal rectilinear motion in the axial direction as a result of the continuous rotation at a constant speed of the input shaft.

In other words, as a result of the continuous rotation at a constant speed of the input shaft, the slider member starts reciprocal rectilinear motion in the axial direction while continuing a rotation motion at an inconstant speed of a specific pattern together with the first output shaft.

On the other hand, the second output shaft is provided coaxially in relation to the first output shaft being subjected to a restriction on its displacement in the axial direction and is provided coaxially with reference to the slider member. Since the second output shaft is engaged with the slider member through the motion converting cam mechanism, the rotation motion at an inconstant speed of the first output shaft is transmitted to the second output shaft through the slider member. In addition, the reciprocal rectilinear motion displacement of the slider member is converted into an oscillating rotation motion displacement and the result is transmitted. In other words, the second output shaft starts a compound motion obtained by compounding the rotational motion at an inconstant speed and the oscillating rotational motion.

Therefore, it is possible to have the second output shaft make a complex motion resulting from compounding an oscillating rotational motion and a rotational motion at an inconstant speed of a specific pattern without giving a complex cam curve to the cam mechanism.

The second output shaft rotating at an inconstant speed with the first output shaft is making a relatively oscillating rotational motion in relation with the first output shaft. In other words, when the motion of a side of the output shaft provided on the same shaft is taken as reference, the other output shaft is making a relative rotational motion constituting a compound motion.

In such a cam apparatus, the slider member and the first output shaft are cylindrical and are engaged successively with the outside of the second output shaft, and the relative rotation regulating cam mechanism includes grooved cams for regulating relative rotation formed linearly in the axial direction on the outside of the slider member and oscillators for regulating relative rotation provided inside the first output shaft being engaged slidably with the grooved cams for regulating relative rotation. The motion converting cam mechanism includes grooved cams for driving oscillating rotations helically formed having a given displacement angle along the axial direction inside the slider member and oscillators for driving oscillating rotations provided on the outside of the second output shaft engaged slidably with the grooved cams for driving oscillating rotation.

Since the grooved cams for regulating relative rotation of the relative rotation regulating cam mechanism and the grooved cams for driving oscillating rotations of the motion converting cam mechanism that determine the rotational motion pattern of the second output shaft are formed in the slider member, by preparing various types of slider members that have varied the displacement angle of the grooved cams for driving oscillating rotations and changing the slider members, such a cam apparatus can easily change the rotational motion pattern of the second output shaft. By adjusting the displacement angle as required, desired oscillating rotational motion can be easily realized.

In such a cam apparatus, the rotational motion converting cam mechanism includes a globoidal cam fixed on the input shaft and cam followers fixed on the first output shaft and engaged with the globoidal cam.

By using such a cam apparatus, the cam curve of the globoidal cam and the number of cam followers can be set as required, and the rotational motion at an inconstant speed of the specific pattern can be easily set as oscillating rotational motion and intermittent rotational motions, etc.

In such a cam apparatus, the cam link mechanism includes end grooved cams provided at the end of the globoidal cam, an annular engaging groove formed integrally and annularly on the outside of the slider member protruding at the end of the first output shaft and an oscillating arm the point of force of which is engaged slidably with the end grooved cam, the point of action of which is engaged slidably with the annular engaging groove and the support point of which is rotatably supported on the housing.

When such a cam apparatus is used, by setting the cam curve of end grooved cams as required, the reciprocal rectilinear motion of the slider member can be changed, and the oscillating rotational motion of the second output shaft can be easily changed through the motion converting cam mechanism.

The pick and place apparatus includes such a cam apparatus, arm members fixed on the first output shaft and flexible in the radial direction, an expansion and contraction driving means that converts the relative rotation developing between the first output shaft and the second output shaft into the expansion and contraction motion of the arm members and transmits the result. The rotational motion at an inconstant speed of the specific pattern of the first output shaft is an intermittent indexing rotational motion, and the reciprocal rectilinear motion of the slider member is executed during the stationing of the intermittent indexing rotational motion so that the arm members expand and contract during the period of stationing at the indexing position.

In such a pick and place apparatus, when the input shaft is continuously rotated at a constant speed by the driving source, as a result of the rotation the first output shaft repeats intermittent indexing rotation consisting of indexing and stationing, and arm members fixed on the first output shaft also executes intermittent indexing rotation.

During the stationing of the first output shaft, following the reciprocal rectilinear motion of the slider member, the second output shaft starts oscillating rotational motion leading to a relative rotation between the second output shaft and the first output shaft. Therefore, either one of the outward or inward trip portion of the oscillating rotation causes the arm member to expand and the other motion causes the arm member to contract.

Therefore, by inputting only one most basic motion of moving the input shaft continuously and at a constant speed by one driving source, the whole operation of the pick and place apparatus consisting of indexing the position of the arm member, expanding the arm member at the indexed position to pick up a work piece, and after a contraction indexing again the arm member, and expanding the arm member at the indexed position to deliver a work piece.

Since the arm member expands linearly in the radial direction and approaches the work piece, even if the area around the work delivery position is narrow, it is possible to approach the work piece and deliver the same. Moreover, as the arm member can be contracted for indexing rotation, the revolution radius of the arm member is small and the space occupied during indexing is limited.

The pick and place apparatus includes such a cam apparatus, snatching means consisting of a pair of snatching arms one end of which is rotatably supported on the base member fixed on the first output shaft, an opening and closing driving means that converts the relative rotation developing between the first output shaft and the second output shaft into the unfolding and folding motion of the snatching means and transmits the result. The rotational motion at an inconstant speed of the specific pattern of the first output shaft is an intermittent indexing rotational motion, and the reciprocal rectilinear motion of the slider member is executed during the stationing of the intermittent indexing rotational motion so that the snatching means execute the unfolding and folding motion during the period of stationing at the indexing position.

In such a pick and place apparatus, when the input shaft is continuously rotated at a constant speed by the driving source, as a result of the rotation the first output shaft repeats intermittent indexing rotation consisting of indexing and stationing, and the snatching means integrally with the base members fixed on the first output shaft also executes intermittent indexing rotation.

During the stationing of the first output shaft, following the reciprocal rectilinear motion of the slider member, the second output shaft starts oscillating rotational motion leading to a relative rotation between the second output shaft and the first output shaft. Therefore, either one of the outward or inward trip portion of the oscillating rotation causes the snatching means to unfold and the other motion causes the snatching means to fold.

Therefore, by inputting only one most basic motion of moving the input shaft continuously and at a constant speed by one driving source, the whole operation of the pick and place apparatus consisting of indexing the position of the snatching means, folding the snatching means at the indexed position to snatch a work piece, and after a snatch indexing again the position of the snatching means, and unfolding the snatching means at the indexed position to deliver the work piece.

According to this preferred embodiment described above, as it is possible to make the output shaft to perform a complex operation resulting from compounding oscillating rotational motion and rotational motion at an inconstant speed of a specific pattern without creating a complex cam curve, a cam apparatus can be manufactured without requiring long hours of work for such as designing the cam curve, and its productivity improves and costs can be reduced. Further, as it is possible to take the motion at one of the two output shafts provided on a same shaft as the reference and to make the other output shaft to execute relative rotational motion, this cam apparatus can be used for a variety of uses.

As it is possible to easily change the pattern of oscillating rotational motion of the second output shaft by changing the slider member to one with a different form of grooved cam, it is unnecessary to change the whole cam apparatus in order to change the motion pattern. Therefore, component parts can be standardized and costs can be reduced. Also, the establishment of appropriate forms of the grooved cam enables to produce a variety of motion patterns of cam apparatuses, and to easily provide motion patterns of cam apparatuses responding to the desires of customers.

The establishment of appropriate cam curves for the globoidal cams enables to easily set the rotational motion at an inconstant speed of a specific pattern for oscillating rotational motion, intermittent rotational motion, etc. Thus, such cam curves can be established for motion patterns meeting the desires of customers and may meet their needs.

In addition, the establishment of certain cam curves for the end grooved cams enables to easily change the oscillating rotational motion of the second output shaft, to increase the patterns of oscillating rotational motion and to enhance the degree of freedom in designing. Therefore, it will be possible to respond fully to the motion patterns desired by customers and to meet their needs.

As it is possible to control the whole pick and place operation by continuously operating the input shaft at a constant speed, the number of motors and other drives can be minimized and therefore costs can be reduced. Furthermore, as it is possible to hold work pieces even if the area around the delivery position of work pieces is narrow, and the space occupied for the indexing operation is limited, the whole apparatus can be installed even in a narrow space, and all these enhance the degree of freedom in the layout work for the arrangement of other machines.

As it is possible to control the whole pick and place operation by continuously operating the input shaft at a constant speed, the number of motors and other drives can be minimized and therefore costs can be reduced.

What is claimed is:

1. A cam apparatus comprising:

an input shaft rotatably supported on a housing to be rotated continuously at a constant speed;

a first output shaft rotatably supported on said housing and to which rotational motion at an inconstant speed of a specific pattern resulting from the conversion of the continuous rotational motion at a constant speed of said input shaft is transmitted through a rotational motion converting cam mechanism;

a slider member provided coaxially to said first output shaft and capable of relative displacement along the axial direction through a relative rotation regulating cam mechanism while its relative rotation with said first output shaft is regulated, and to which a reciprocal rectilinear motion in the axial direction of the first output shaft resulting from the conversion of the continuous rotational motion at a constant speed of said input shaft is transmitted through a cam link mechanism;

a second output shaft provided coaxially to said first output shaft and rotatably while its movement in said axial direction is regulated; and a motion converting cam mechanism interposed between said second output shaft and said slider member, which converts the reciprocal rectilinear motion displacement of said slider member into the oscillating rotational motion displacement of said second output shaft to transmit the same thereto, and transmits the rotational motion at an inconstant speed of said slider member to said second output shaft, wherein the oscillating rotational motion of said slider member and the rotational motion at an inconstant speed of a specific pattern of said first output shaft are compounded and are transmitted to said second output shaft.

2. A cam apparatus according to claim 1, wherein, said slider member and the first output shaft are cylindrical and are disposed being successively engaged to the outside of said second output shaft, said relative rotation regulating cam mechanism comprises a grooved cam for regulating relative rotation formed rectilinearly along the axial direction on the outside surface of the slider member, and a sliding piece for regulating relative rotation provided in said first output shaft being engaged slidably with said grooved cam for regulating relative rotation, and said motion converting cam mechanism comprises, a grooved cam for driving oscillating rotation formed helically with a given displacement angle along the axial direction in said slider member, and a sliding piece for driving oscillating rotation provided outside of the second output shaft being engaged slidably with said grooved cam for driving oscillating rotation.

3. A cam apparatus according to claim 2, wherein said rotational motion converting cam mechanism comprises a globoidal cam fixed on the input shaft, and a cam follower fixed on the first output shaft and engaged with said globoidal cam.

4. A cam apparatus according to claim 3, wherein said cam link mechanism comprises:

an end surface grooved cam provided at one end of said globoidal cam;

an annular engaging groove integrally formed annularly at the end portion of said slider member protruding from the end of said first output shaft; and an oscillating arm where the point of force of which is engaged slidably with said end surface grooved cam, the point of action of which is engaged slidably with said annular engaging groove, and the point of support of which is pivotally supported on the housing.

* * * * *